United States Patent
Jang et al.

(10) Patent No.: US 8,258,563 B2
(45) Date of Patent: Sep. 4, 2012

(54) MULTI-LAYER MEMORY DEVICES

(75) Inventors: Young-Chul Jang, Gyeonggi-do (KR);
Ki-Nam Kim, Gyeonggi-do (KR);
Soon-Moon Jung, Gyeonggi-do (KR);
Jae-Hoon Jang, Gyeonggi-do (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 13/049,495

(22) Filed: Mar. 16, 2011

(65) Prior Publication Data

US 2011/0163411 A1 Jul. 7, 2011

Related U.S. Application Data

(60) Continuation of application No. 12/478,538, filed on Jun. 4, 2009, now Pat. No. 7,910,433, which is a division of application No. 11/654,133, filed on Jan. 17, 2007, now abandoned.

(30) Foreign Application Priority Data

Oct. 23, 2006 (KR) ................... 2006-103050

(51) Int. Cl.
*H01L 29/76* (2006.01)
(52) U.S. Cl. ............... 257/314; 257/67; 257/E21.614; 438/257
(58) Field of Classification Search .......... 257/E21.614, 257/67
See application file for complete search history.

(56) References Cited

U.S. PATENT DOCUMENTS

| 5,888,853 | A | 3/1999 | Gardner et al. |
| 6,841,813 | B2 | 1/2005 | Walker et al. |
| 2004/0144979 | A1 | 7/2004 | Bhattacharyya |
| 2006/0108627 | A1 | 5/2006 | Choi et al. |
| 2007/0096197 | A1* | 5/2007 | Jang et al. .......... 257/315 |
| 2007/0158731 | A1* | 7/2007 | Bae et al. .......... 257/314 |

FOREIGN PATENT DOCUMENTS

| JP | 05-167080 | 7/1993 |
| JP | 2002-368140 | 12/2002 |
| KR | 1997-0067903 A | 10/1997 |
| KR | 1999-012155 A | 2/1999 |
| KR | 1020050008521 A | 1/2005 |
| KR | 1020050039627 A | 4/2005 |
| KR | 1020060026745 A | 3/2006 |
| KR | 10-2006-0057821 | 5/2006 |
| KR | 1020060089154 A | 8/2006 |

OTHER PUBLICATIONS

Notice of Allowance for Korean Patent Application No. 10-2006-0103050; Sep. 27, 2007.
English translation of the Notice of Allowance for Korean Patent Application No. 10-2006-0103050; Sep. 27, 2007.

* cited by examiner

*Primary Examiner* — Michelle Mandala
*Assistant Examiner* — Shaka Scarlett
(74) *Attorney, Agent, or Firm* — Myers Bigel Sibley & Sajovec, P.A.

(57) ABSTRACT

A nonvolatile memory device includes a semiconductor substrate having a first well region of a first conductivity type, and at least one semiconductor layer formed on the semiconductor substrate. A first cell array is formed on the semiconductor substrate, and a second cell array formed on the semiconductor layer. The semiconductor layer includes a second well region of the first conductivity type having a doping concentration greater than a doping concentration of the first well region of the first conductivity type. As the doping concentration of the second well region is increased, a resistance difference may be reduced between the first and second well regions.

9 Claims, 21 Drawing Sheets

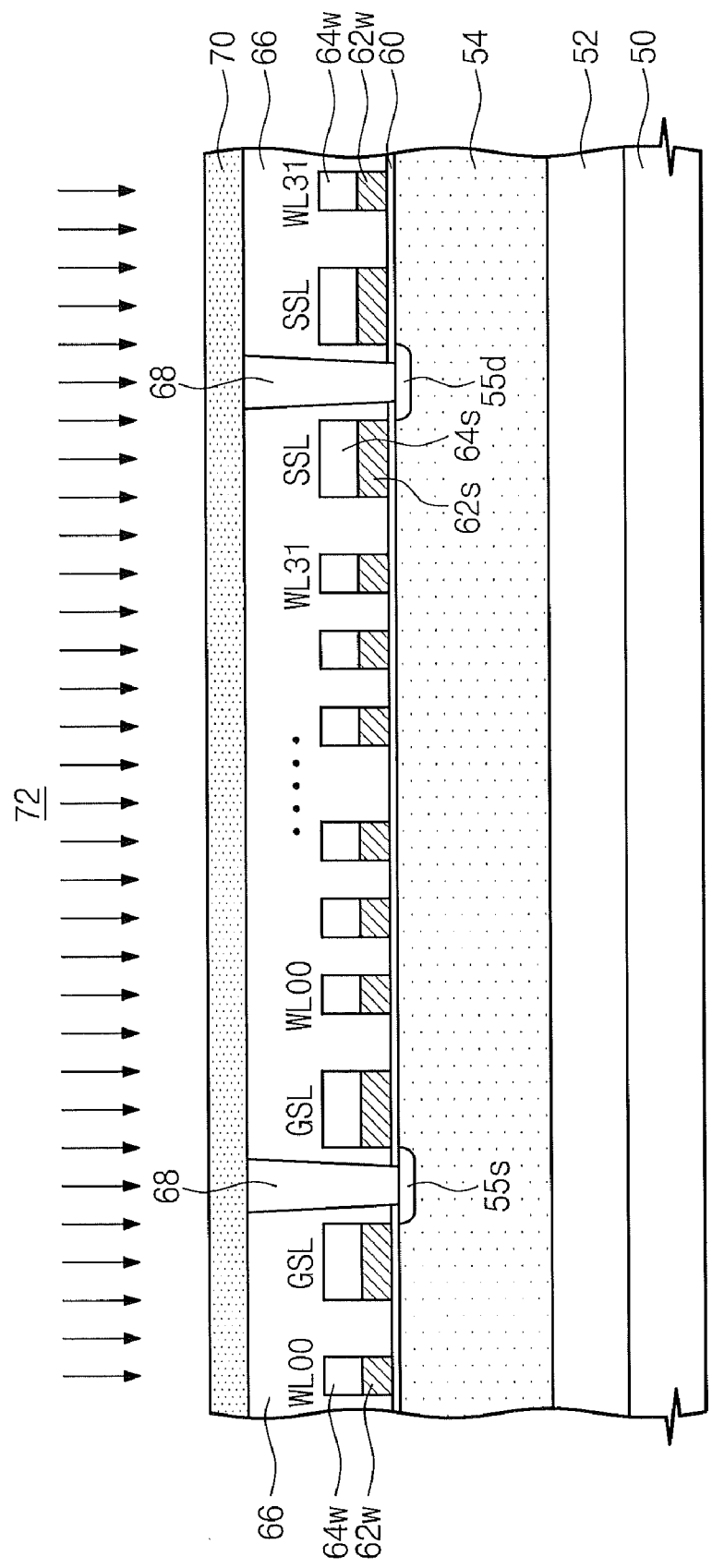

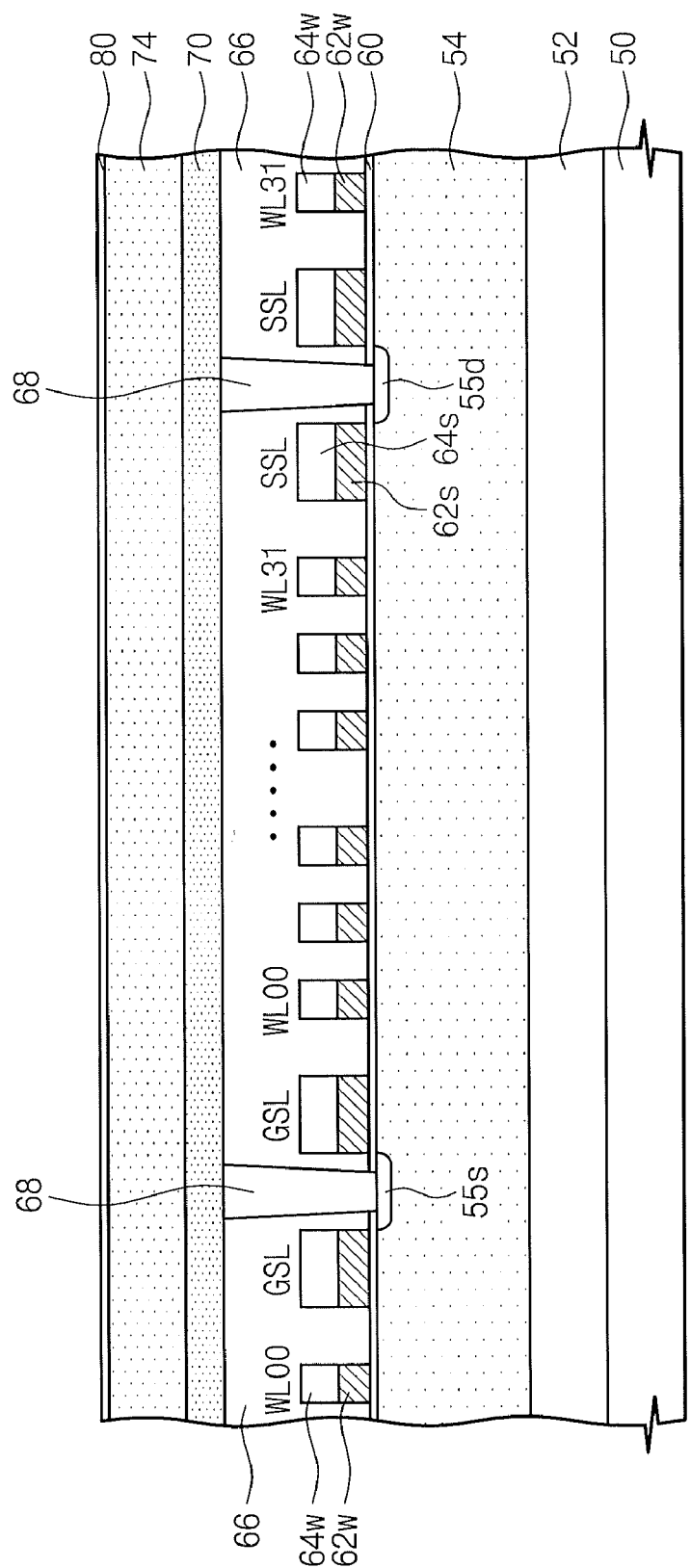

MULTI-LAYER MEMORY DEVICES

CROSS-REFERENCE TO RELATED APPLICATIONS

The present application is a continuation of U.S. patent application Ser. No. 12/478,538 now U.S. Pat. No. 7,910,433 filed in the United States Patent Office on Jun. 4, 2009, which is a divisional application of U.S. patent application Ser. No. 11/654,133, filed in the United States Patent Office on Jan. 17, 2007 now abandoned, and claims priority under 35 U.S.C. §119 to Korean Patent Application No. 2006-103050, filed on Oct. 23, 2006, the entire contents of which are hereby incorporated by reference.

BACKGROUND OF THE INVENTION

The present invention disclosed herein relates to semiconductor devices and methods of fabricating the same, and, more particularly, to multi-layer nonvolatile memory devices and methods of fabricating the same.

Semiconductor devices have, generally, reached the limit of reducing a horizontal size thereof, and, thus, a three-dimensional structure with a plurality of cell array layers stacked has been researched to overcome such a limit.

To form a cell array layer in a multi-layer, a plurality of semiconductor layers may be formed on a semiconductor substrate. However, there may be a limit in a thickness of a semiconductor layer compared to a thickness of a semiconductor substrate, and, therefore, a device formed on a semiconductor substrate may be different from a device formed on a semiconductor layer in the uniformity of their property.

FIG. 1 is a cross-sectional view of a conventional multi-layer nonvolatile memory device.

Referring to FIG. 1, a nonvolatile memory device may be formed in a NAND cell array structure. The NAND cell array structure includes a ground select line GSL and a string select line SSL that cross over a plurality of parallel active regions, and a plurality of word lines WLn. The word lines are disposed between the ground select line GSL and the string select line SSL to cross over the active regions. The ground select line GSL, the string select line SSL, and the word lines WLn are disposed mirror-symmetrically in a cell array.

An n-well region 12 and a p-well region 14 surrounded by the n-well region 12 are formed in a semiconductor substrate 10. A plurality of p-well regions 14 may be formed in a first cell array region, and the p-well regions 14 may be isolated by the n-well region 12.

The ground select line GSL and the string select line SSL may include a select gate 18s formed on a gate insulating layer 16, and a mask pattern 20s may be formed on the select gate 18s. The word line WLn may include a gate electrode 18w formed on the gate insulating layer 16 and a mask pattern 20w formed on the gate electrode 18w. The gate insulating layer 16 may be a tunnel insulating layer in a floating gate type nonvolatile memory device, or may be a multi-layered charge trap layer in a charge trap type nonvolatile memory device.

At least one semiconductor layer 26 may be formed over the semiconductor substrate 10, and a second cell array region may be formed on the semiconductor layer 26. The second cell array region may have the same disposition structure as the cell array region formed on the semiconductor substrate 10. For example, the ground select line GSL and the string select line SSL may include a select gate 30s formed on a gate insulating layer 28, and mask pattern 32s may be formed on the select gate 30s. The word line WLn may include a gate electrode 30w formed on the gate insulating layer 28 and a mask pattern 32w formed on the gate electrode 30w. The gate insulating layer 28 may be a tunnel insulating layer in a floating gate type nonvolatile memory device, or a multi-layer charge trap layer in a charge trap type nonvolatile memory device.

An interlayer insulating layer 22 is interposed between the semiconductor layer 26 and the semiconductor substrate 10. Although not shown, an interlayer insulating layer is interposed between the semiconductor layer 26 and another semiconductor layer. The semiconductor layer 26 may be crystal-grown from a semiconductor plug 24 that penetrates the interlayer insulating layer 22 depending on the method of forming the semiconductor layer 26. The semiconductor plug 24 may be an epitaxial layer crystal-grown from another semiconductor layer or semiconductor substrate thereunder.

Generally, a cell array of a nonvolatile memory device may be divided into a plurality of erase blocks, and the erase blocks are divided into p-well regions isolated by an n-well region. The erase blocks may have a predetermined potential in an operating process. Therefore, it may be desirable for a resistance of the p-well regions to be uniform for the uniformity of a bias applied to memory cells.

As illustrated, because the semiconductor layer 26 is formed over the second cell array region, its thickness may be limited due to the property degradation of the transistors formed thereunder. Therefore, a well region formed in the semiconductor layer 26 may have a limit in increasing its depth, compared to the thick semiconductor substrate 10. Consequently, there may be a difference between a well region formed in the semiconductor layer 26 and a well region formed in the semiconductor substrate 10. In addition, the well region formed in the semiconductor layer 26 may have a relatively high electrical resistance, and, thus, dispersion of a memory cell transistor characteristics may increase.

SUMMARY OF THE INVENTION

Some embodiments of the present invention provide a multi-layer nonvolatile memory device where there is little difference between the well resistance of a semiconductor layer and the well resistance of a semiconductor substrate.

According to some embodiments of the present invention, a nonvolatile memory device includes a semiconductor layer that includes a well region having a doping concentration that is higher than the doping concentration of a well region formed in a semiconductor substrate. A nonvolatile memory device, according to some embodiments of the present invention, includes a semiconductor substrate having a first well region of a first conductivity type and at least one semiconductor layer formed on the semiconductor substrate. A first cell array is formed on the semiconductor substrate, and a second cell array is formed on the semiconductor layer. The semiconductor layer includes a second well region of a first conductivity type having a concentration greater than a concentration of the first well region of the first conductivity type.

In some embodiments, a resistance difference between the first and second well regions may be decreased by increasing a concentration of the second well region. For example, a surface doping concentration of the semiconductor layer may be greater than a well doping concentration thereunder, and a surface doping concentration of the semiconductor layer may be equal or similar to a surface doping concentration of the semiconductor substrate. Therefore, a resistance difference between the semiconductor substrate and the semiconductor layer may be reduced, and a difference in impurity concentration may be reduced between surfaces of the semiconductor substrate and the semiconductor layer where unit devices are formed, thereby improving the property uniformity of the device.

In other embodiments of the present invention, nonvolatile memory devices may be formed that include a semiconductor layer that includes a well region having a doping concentration greater than a doping concentration of a well region formed in a semiconductor substrate. A first well region is formed in a semiconductor substrate having a first conductivity type, and an interlayer insulating layer is formed on the semiconductor substrate. A semiconductor layer is formed on the interlayer insulating layer. A second well region of the first conductivity type is formed in the semiconductor layer, and a doping concentration of the second well region is greater than a doping concentration of the first well region.

BRIEF DESCRIPTION OF THE DRAWINGS

Other features of the present invention will be more readily understood from the following detailed description of exemplary embodiments thereof when read in conjunction with the accompanying drawings, in which:

FIGS. 4A through 7A are views taken along the line I-I' of FIG. 2 for illustrating methods of fabricating a nonvolatile memory device according to some embodiments of the present invention;

FIGS. 4B through 7B are views taken along the line II-II' of FIG. 2 for illustrating methods of fabricating a nonvolatile memory device according to some embodiments of the present invention;

FIGS. 8A through 10A are views taken along the line I-I' of FIG. 2 for illustrating methods of fabricating a nonvolatile memory device according to further embodiments of the present invention;

FIGS. 8B through 10B are views taken along the line II-II' of FIG. 2 for illustrating methods of fabricating a nonvolatile memory device according to further embodiment of the present invention;

DETAILED DESCRIPTION

Figure 1:
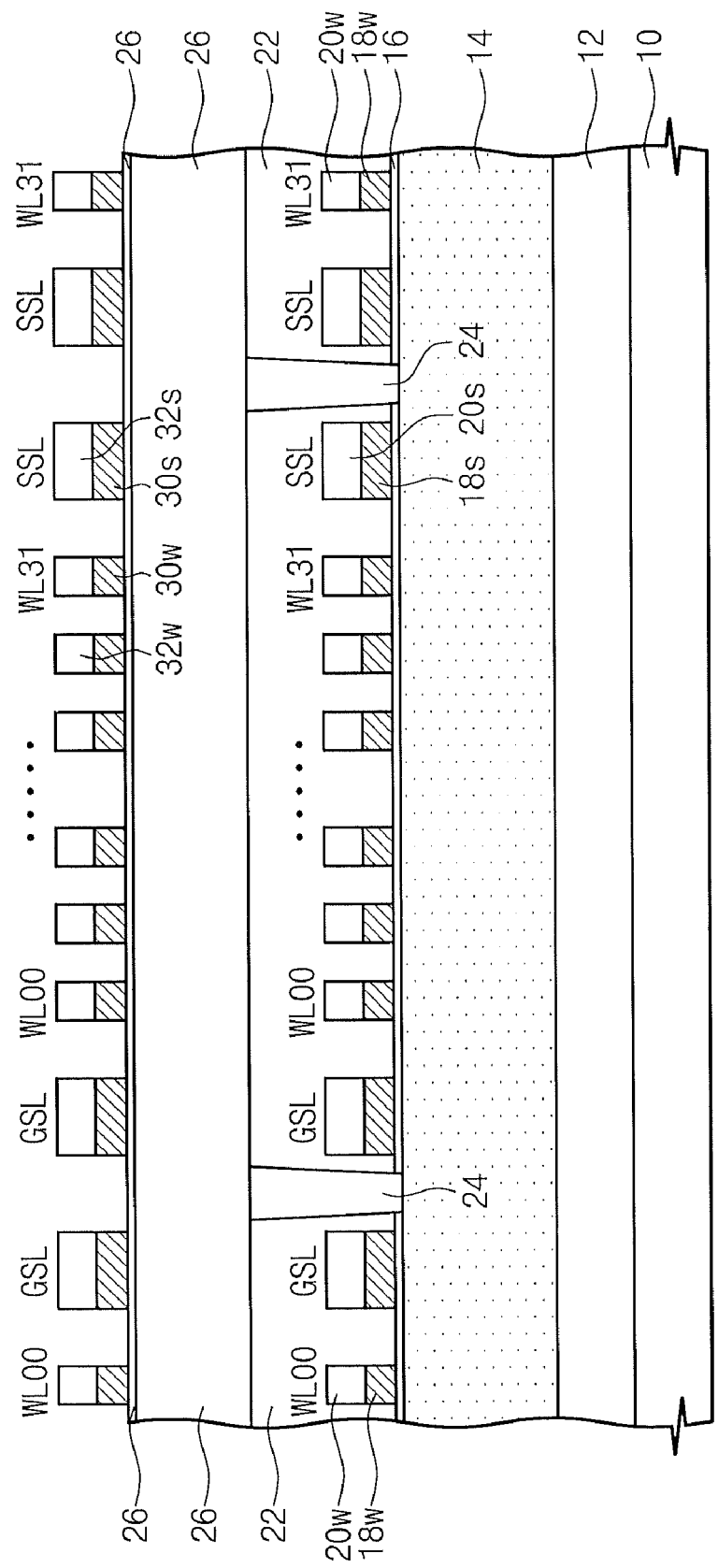
FIG. 1 is a cross-sectional view of a conventional multi-layer nonvolatile memory device.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the description of the figures.

It will be understood that when an element is referred to as being "on" another element, it can be directly on the other element or intervening elements may be present. In contrast, when an element is referred to as being "directly on" another element, there are no intervening elements present. It will be understood that when an element is referred to as being "connected" or "coupled" to another element, it can be directly connected or coupled to the other element or intervening elements may be present. In contrast, when an element is referred to as being "directly connected or coupled" to another element, there are no intervening elements present. Furthermore, "connected" or "coupled" as used herein may include wirelessly connected or coupled. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in one of the figures were turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

In the description, a term "substrate" used herein may include a structure based on a semiconductor, having a semiconductor surface exposed. It should be understood that such a structure may contain silicon, silicon on insulator, silicon on sapphire, doped or undoped silicon, epitaxial layer supported by a semiconductor substrate, or another structure of a semiconductor. And, the semiconductor may be silicon-germanium, germanium, or germanium arsenide, not limited to silicon. In addition, the substrate described hereinafter may be one in which regions, conductive layers, insulation layers, their patterns, and/or junctions are formed.

Figure 2:
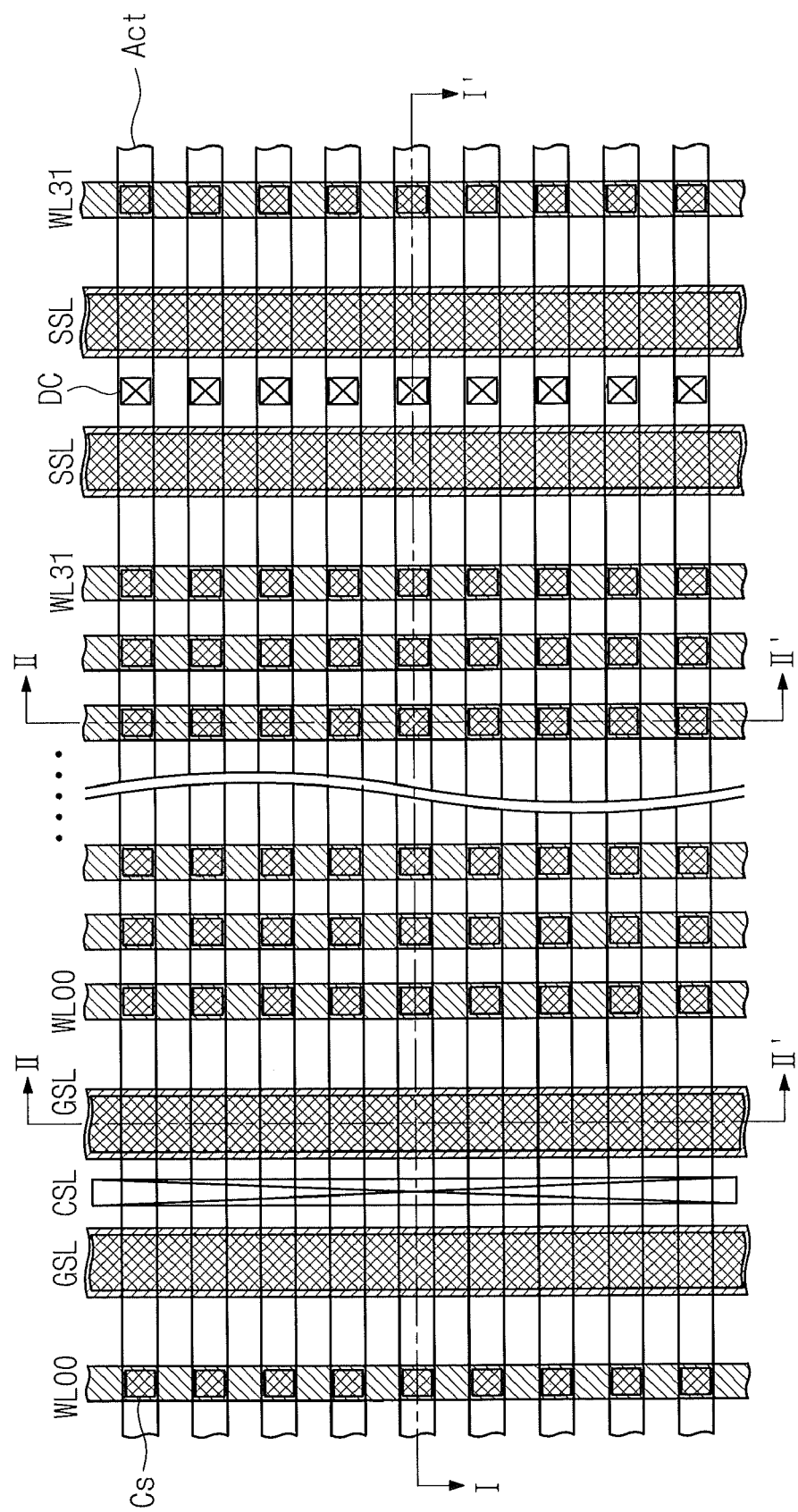
FIG. 2 is a plan view of a conventional multi-layer nonvolatile memory device.

FIG. 2 is a plan view of a conventional nonvolatile memory device having a NAND type cell array.

Referring to FIG. 2, a device isolation layer is formed in a semiconductor substrate to define a plurality of active regions Act. A first cell array region includes a ground select line GSL and a string select line SSL that cross over the active regions, and a plurality of word lines WLn. The word lines WLn are disposed between the ground select line GSL and the string select line SSL to cross over the active regions. The ground select line GSL, the string select line SSL, and the word lines WLn are disposed mirror-symmetrically in the first cell array.

An information storage Cs is located at an intersecting portion between the word line WLn and the active region Act. The information storage Cs may be a floating gate or a charge trap layer. A common source line CSL is disposed between the ground select lines GSL to electrically connect source regions formed in the active regions Act thereunder. Bit line contacts DC are connected to active regions between the string select lines SSL, respectively.

Figure 3A:
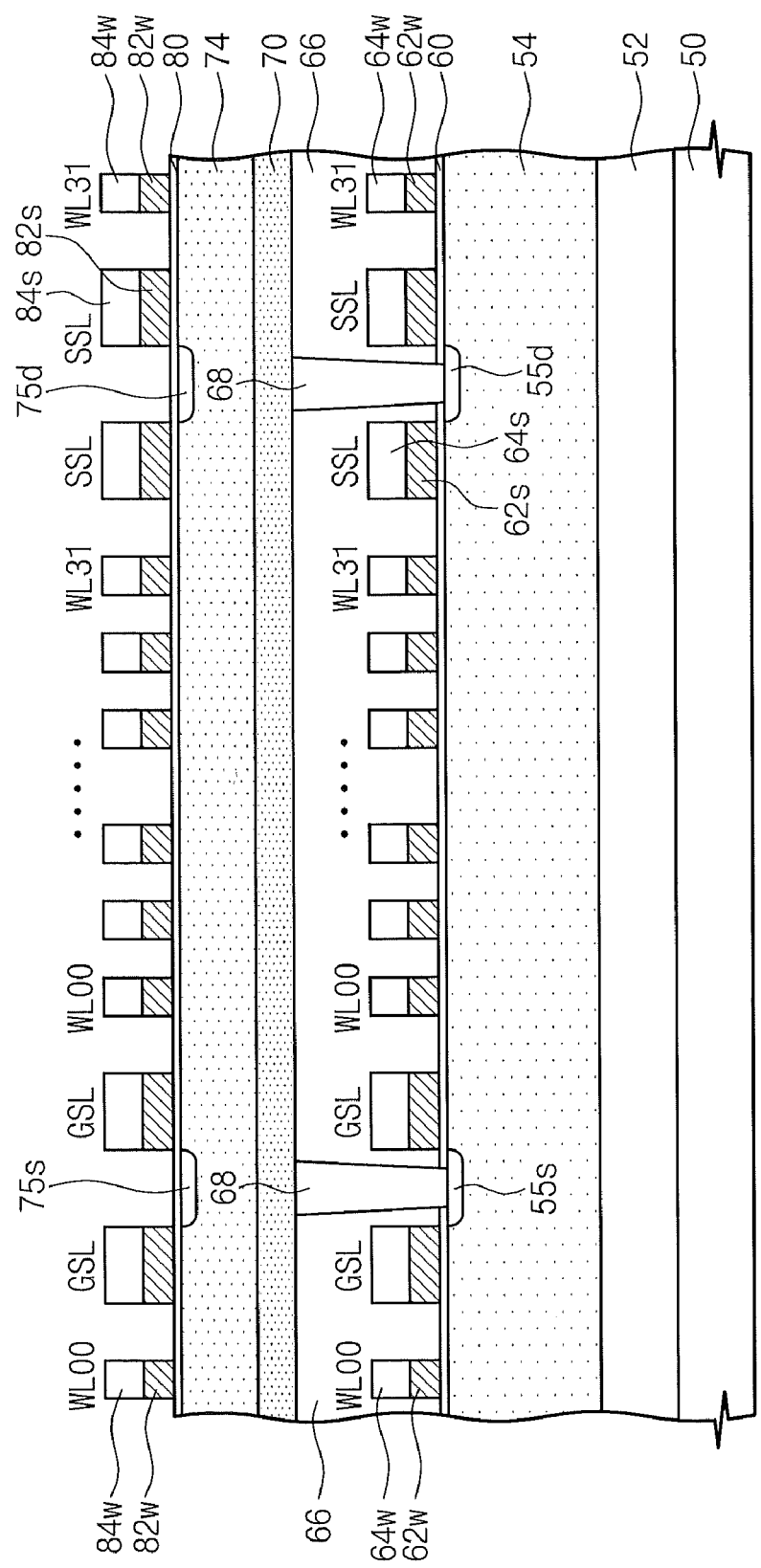
FIGS. 3A and 3B are cross-sectional views taken along lines I-I' and II-II' of FIG. 2, respectively, according to some embodiments of the present invention.
Figure 3B:
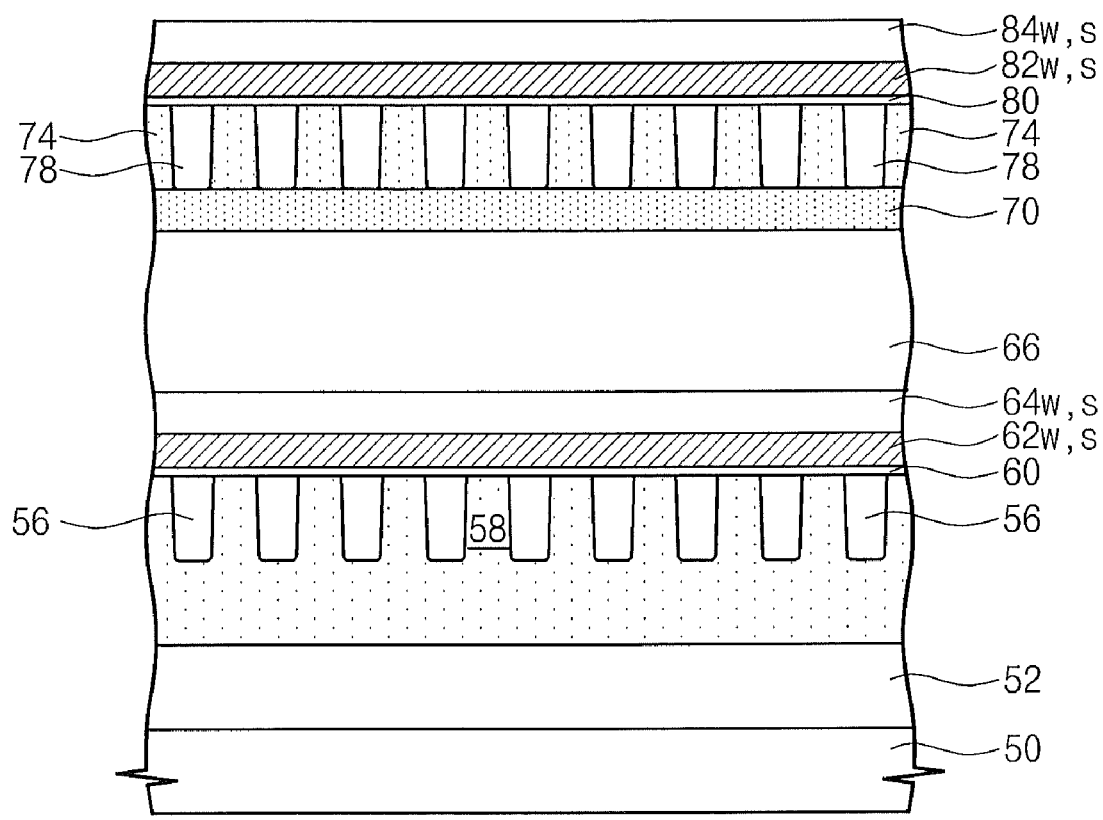

FIGS. 3A and 3B are cross-sectional views taken along lines I-I' and II-II' of FIG. 2 for illustrating a nonvolatile memory device, respectively, according to some embodiments of the present invention.

Referring to FIGS. 3A and 3B, a first well region of a first conductivity type 54 is formed in a semiconductor substrate 50, and the first well region 54 is surrounded by a second conductive well region 52. The semiconductor substrate 50 may be a p-type substrate, the first well region 54 may be a p-type well region, and the second conductivity type well region 52 may be an n-type well region. A plurality of p-well regions 54 may be formed in the first cell array region, and the p-well regions 54 may be isolated from each other by the n-well region 52.

The ground select line GSL and the string select line SSL include a select gate 62s formed on a gate insulating layer 60, a mask pattern 64s may be formed on the select gate 62s. The word line WLn may include a gate electrode 62w formed on the gate insulating layer 60 and a mask pattern 64w formed on the gate electrode 62w. The gate insulating layer 60 may be a tunnel insulating layer in a floating gate type nonvolatile memory device, and may be a multi-layered charge trap layer in a charge trap type nonvolatile memory device.

At least one semiconductor layer may be formed over the semiconductor substrate 50. The semiconductor layer may include a first semiconductor layer 70 and a second semiconductor layer 74 formed on the first semiconductor layer 70. A second cell array region may be disposed on the second semiconductor layer 74. The second cell array may also have the same disposition structure as the first cell array region formed on the semiconductor substrate 50. For example, the ground select line GSL and the string select line SSL may include a select gate 82s formed on a gate insulating layer 80, and a mask pattern 84s may be formed on the select gate 82s. The word line WLn may include a gate electrode 82w formed on the gate insulating layer 80 and a mask pattern 84w formed on the gate electrode 82w. The gate insulating layer 80 may be a tunnel insulating layer in a floating gate type nonvolatile memory device, and may be a multi-layered charge trap layer in a charge trap type nonvolatile memory device. The second cell array may have a source region 75s and a drain region 75d formed in the second semiconductor layer 74.

An interlayer insulating layer 66 is interposed between the semiconductor layer and the semiconductor substrate 50. Although not shown, an interlayer insulating layer may be interposed between the semiconductor layer and another semiconductor layer. The semiconductor layer may be crystal-grown from a semiconductor plug 68 that penetrates the interlayer insulating layer 66 depending on the method of forming the semiconductor layer. The first semiconductor plug 70 may be an epitaxial layer crystal-grown from another semiconductor layer or semiconductor substrate formed thereunder.

In the first embodiment of the present invention, the semiconductor layer may include a second well region of a first conductivity type having a doping concentration higher than that of the first well region 54. The second well region of a first conductivity type may be formed in the first semiconductor layer 70. That is, p-type impurities may be implanted into the first semiconductor layer 70 to form the second well region of a first conductivity type. The second semiconductor layer 74 may include a third well region of a first conductivity type having a doping concentration equal to or lower than that of the second well region. For example, the second semiconductor layer 74 may be doped with p-type impurities. It some embodiments, the doping concentration of the second semiconductor layer 74 is equal or similar to that of the first well region 54.

In some embodiments of the present invention, the first semiconductor layer 70 may be thinner than the second semiconductor layer 74. A device isolation layer 56 may be disposed in the semiconductor substrate 50 to define a plurality of active regions 58, and a device isolation layer 78 may be disposed in the semiconductor layer to define a plurality of active regions. The device isolation layer 78 may be formed in the second semiconductor layer 74. The thickness of the second semiconductor layer 74 may be controlled to correspond to the thickness of the device isolation layer 78. Therefore, the second semiconductor layer 74 may have a thickness that is sufficient to form a device isolation layer having a thickness suitable for device isolation.

The third well region is formed in the active region between the device isolation layers 78, and thereby its lateral border may be defined by the device isolation layers 78. In some embodiments of the present invention, the second well region of the first semiconductor layer 70 may be doped at a concentration higher than that of the first well region 54 so as to reduce an electrical resistance. The third well region may be doped at a concentration equal or similar to that of the first well region 54 so as to improve the property uniformity of transistors formed on the semiconductor substrate 50.

In further embodiments, the second well region may be formed in the first semiconductor layer 70 such that it is aligned with the device isolation layers 78. That is, the second well region may be limitedly formed in portions of the first semiconductor layer 70 under the second semiconductor layer 74 between the device isolation layers 78.

FIGS. 4A through 7A are sectional views taken along the line I-I' of FIG. 2 for illustrating methods of fabricating a nonvolatile memory device according to some embodiments of the present invention. FIGS. 4B through 7B are sectional views taken along the line II-II' of FIG. 2 for illustrating methods of fabricating a nonvolatile memory device according to some embodiments of the present invention.

Figure 4A:
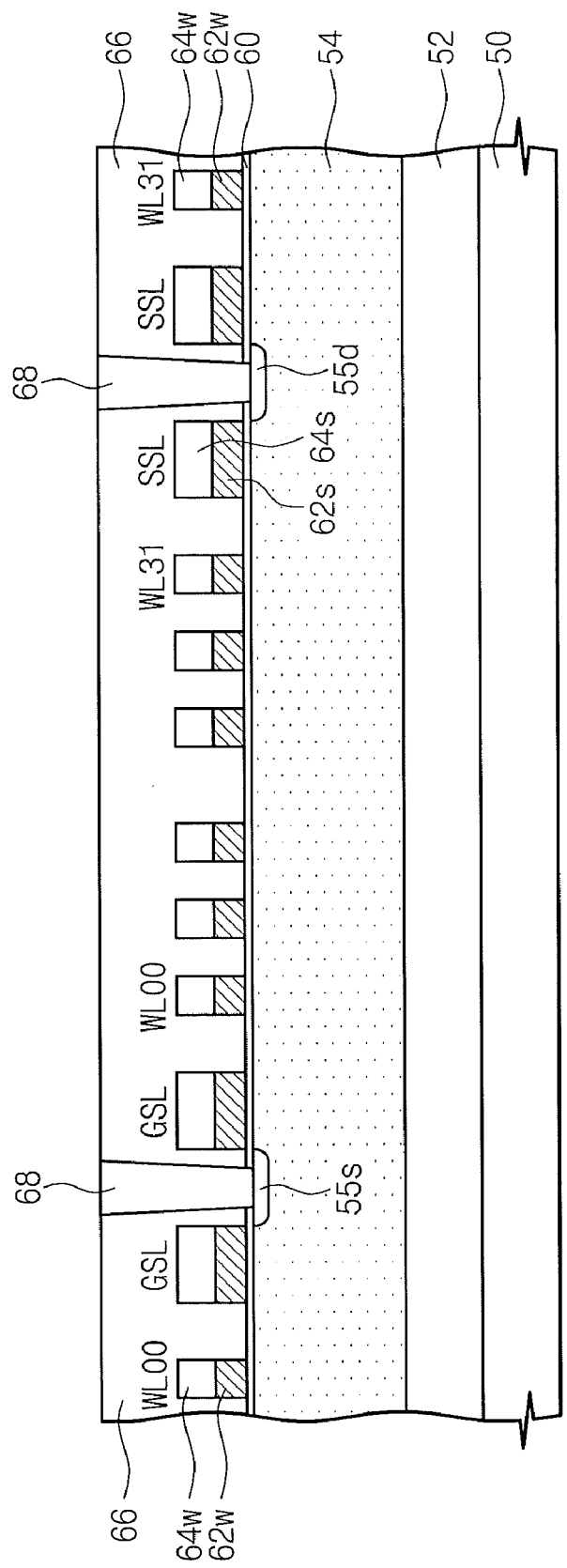
Figure 4B:
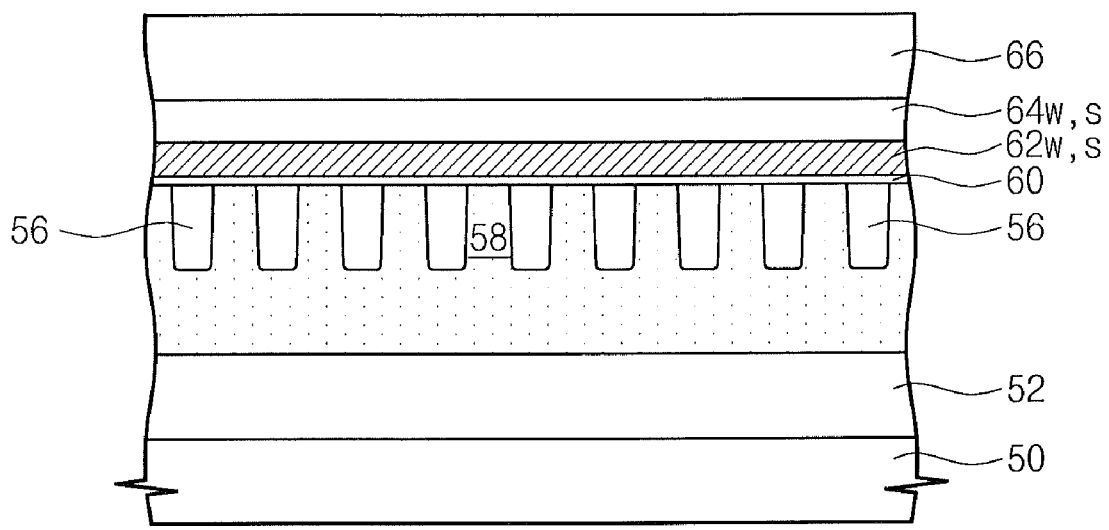

Referring to FIGS. 4A and 4B, a second conductivity type well region 52 is formed in a semiconductor substrate 50, and a first well region 54 of a first conductivity type is formed on the second conductivity type well region 52. The first well region 54 is surrounded by the second conductivity type well region 52. The semiconductor substrate 50 may be a p-type substrate, the first well region 54 may be a p-type well region, and the second conductivity type well 52 may be an n-type well region. A plurality of p-well regions 54 may be formed in a cell array region, and the p-well regions 54 may be isolated from each other by the n-well region 52.

A device isolation layer 56 is formed in the semiconductor substrate 50 to define a plurality of active regions 58. The device isolation layer 56 is formed in the first well region 54 of a first conductivity type. A ground select line GSL, a string select line SSL, and word lines WLn are formed such that they cross over the active regions 58.

The ground select line GSL and the string select line SSL may include a select gate 62s formed on a gate insulating layer 60, and a mask pattern 64s may be formed on the select gate 62s. The word line WLn may include a gate electrode 62w formed on the gate insulating layer 60 and a mask pattern 64w formed on the gate electrode 62w. The gate insulating layer 60 may be a tunnel insulating layer in a floating gate type nonvolatile memory device, and may be a multi-layered charge trap layer in a charge trap type nonvolatile memory device.

An interlayer insulating layer 66 is formed on the semiconductor substrate 50. A semiconductor layer is formed on the interlayer insulating layer 66. The semiconductor layer may be formed by bonding a semiconductor substrate or using crystal growth. A semiconductor plug 68 is formed so as to penetrate the interlayer insulating layer 66 to provide a seed layer for crystal growth. The semiconductor plug 68 may be an epitaxial layer crystal grown from a predetermined region of the semiconductor substrate 50. The epitaxial layer may be grown from a source region 55s and/or a drain region 55d of a cell array.

Figure 5B:
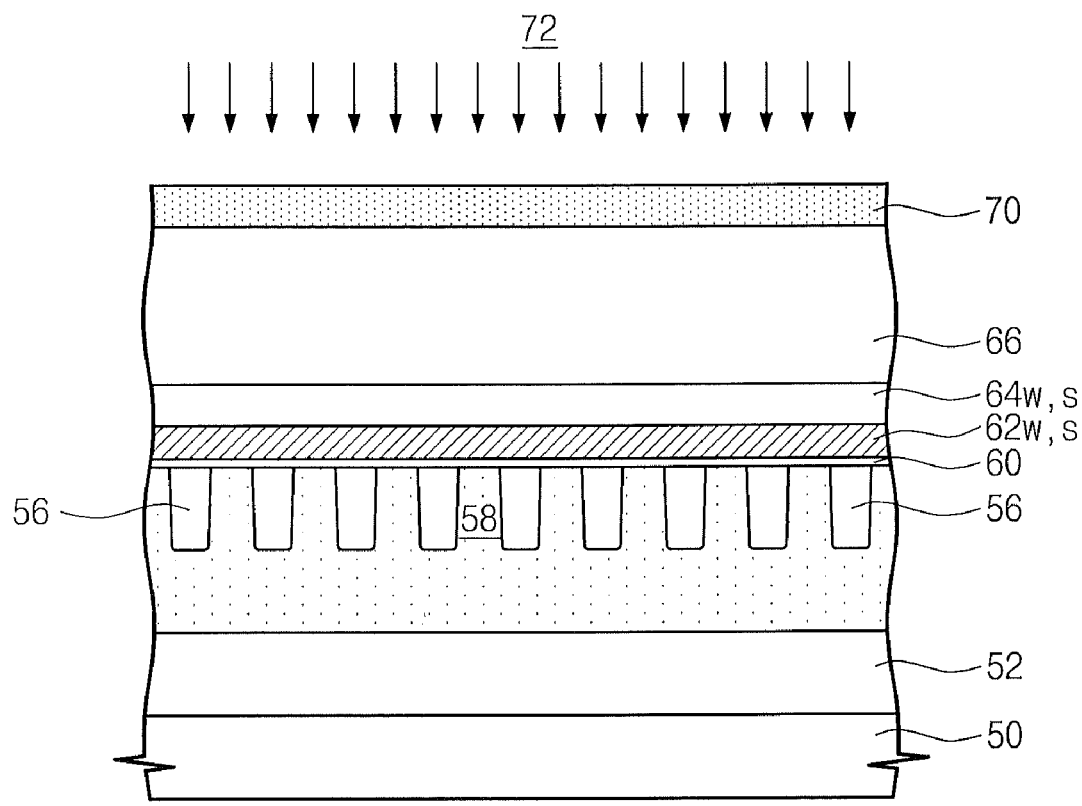

Referring to FIGS. 5A and 5B, a first semiconductor layer 70 is formed through crystal growth from the semiconductor plug 68. The first semiconductor layer 70 may be an epitaxial layer epitaxially grown from the semiconductor plug 68 using chemical vapor deposition (CVD). Alternatively, the first semiconductor layer 70 may be formed by forming amorphous silicon and then crystallizing the amorphous silicon using annealing or laser. The first semiconductor layer 70 may be formed to a thickness of approximately 1000 Å. The first semiconductor layer 70 may be formed at 800° C. or lower to suppress the property degradation of unit devices formed thereunder.

Impurities 72 are implanted into the first semiconductor layer 70 to form a second well region of a first conductivity type having a doping concentration higher than that of the first well region 54. The impurities 72 may be p-type impurities, and a dose of the impurities 72 greater than an impurity dose of the first well region 54 may be implanted. The first semiconductor layer 70 may be the second well region of a first conductivity type.

Figure 6A:
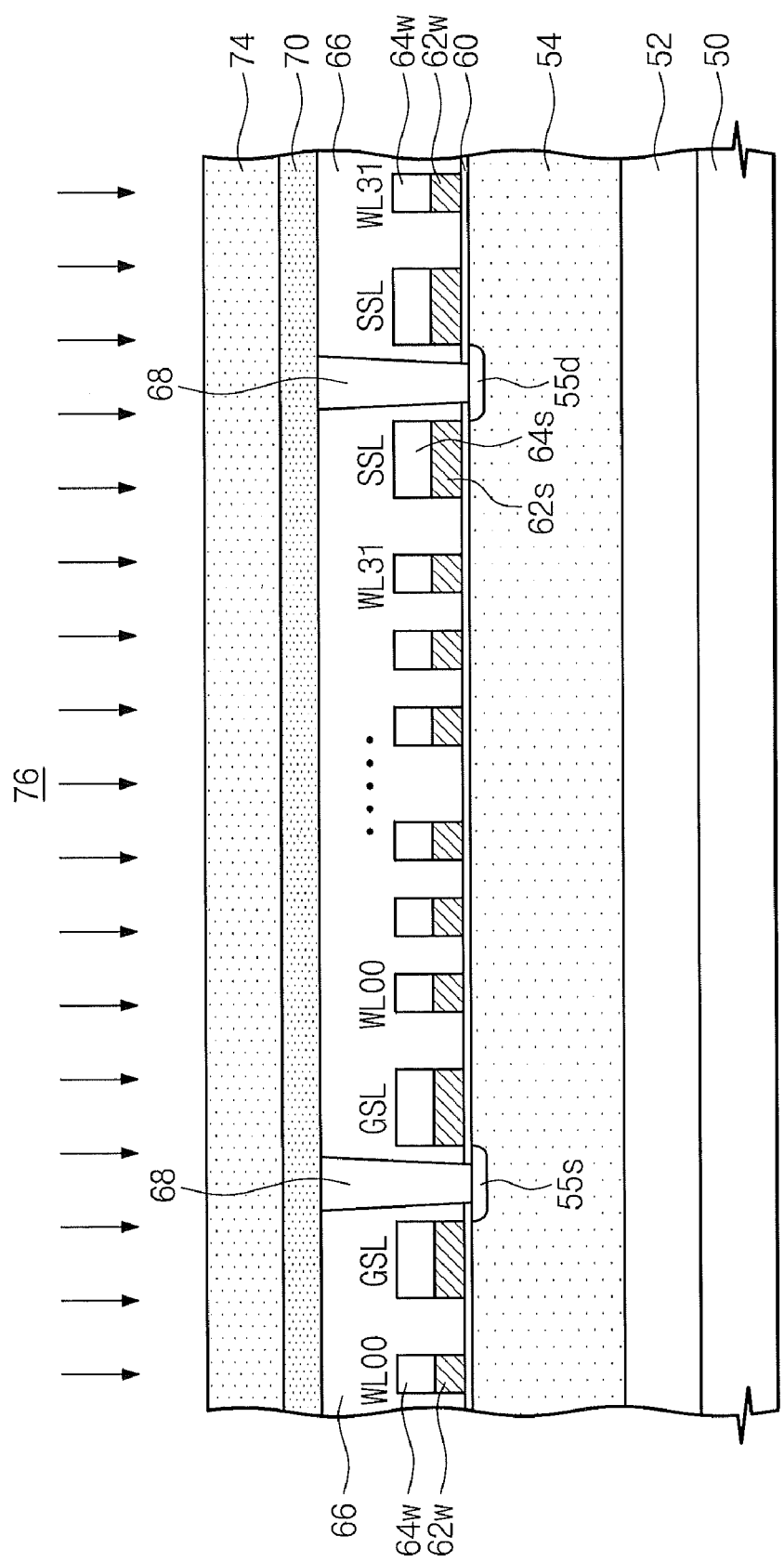
Figure 6B:
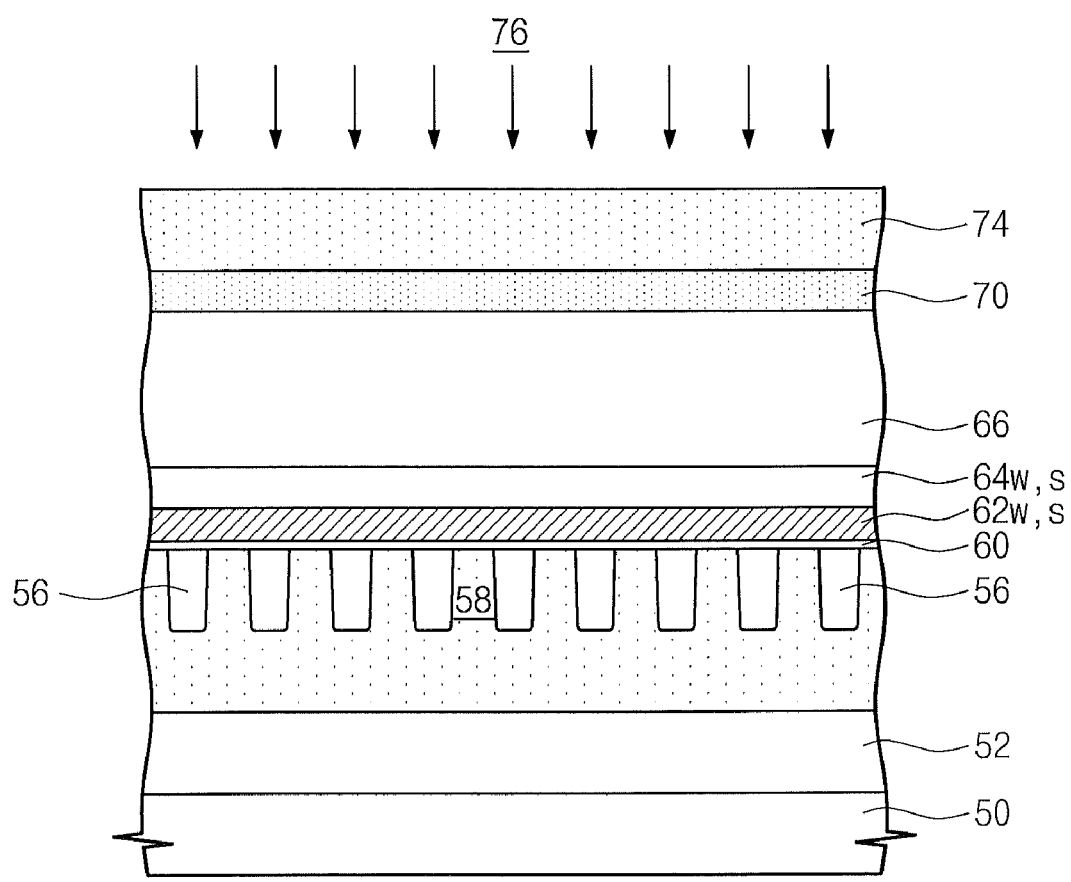

Referring to FIGS. 6A and 6B, a second semiconductor layer 74 is formed on the first semiconductor layer 70. The second semiconductor layer 74 may be crystal grown using the first semiconductor layer 70 as a seed layer. The second semiconductor layer 74 may be formed thicker than the first semiconductor layer 70. Impurities 76 are implanted into the second semiconductor layer 74 to form a third well region of a first conductivity type. The third well region may have a doping concentration less than that of the second well region, and has a doping concentration equal or similar to that of the first well region 54. The second semiconductor layer 74 may be the third well region. Therefore, a doping concentration of the first semiconductor layer 70 may be greater than that of the second semiconductor layer 74.

In some embodiments of the present invention, the second and third well regions may be formed by in situ doping, not using impurity implantation. For example, the second and third well regions may be doped by implanting impurities while the first and second semiconductor layers 70 and 74 are crystal grown.

Figure 7B:
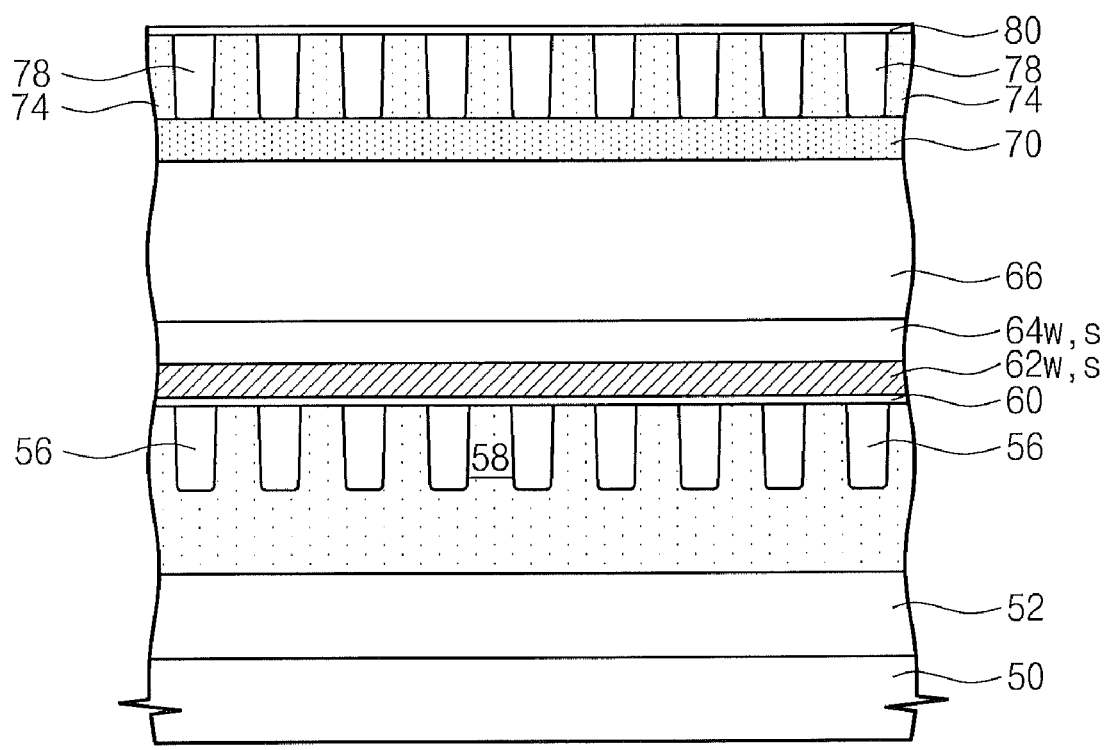

Referring to FIGS. 7A and 7B, the second semiconductor layer 74 is etched to form a trench region, and a device isolation layer 78 is formed such that it fills the trench region. The device isolation layer 78 may be formed only in the second semiconductor layer 74, or may vertically extend to the first semiconductor layer 70. Therefore, the third well region may be limitedly formed between the device isolation layers 78 and its border may be defined by the device isolation layer 78.

Next, a gate insulating layer 80 is formed on the second semiconductor layer 74, and a ground select line, a string select line, and word lines are formed on the gate insulating layer 80 to form the structure illustrated in FIGS. 3A and 3B. Although not shown, a plurality of cell array regions may be formed by repeatedly forming an interlayer insulating layer and a semiconductor layer on the second semiconductor layer 74.

To form the device isolation layer 78 in the second semiconductor layer 74, the semiconductor layer 74 may have a sufficient thickness for device isolation. Although not shown, wiring is connected to the semiconductor substrate 50 so as to penetrate the semiconductor layer. When the semiconductor layer is thick, the etching burden may increase. Therefore, the semiconductor layer that the wiring penetrates may be thin. In this respect, a method may be provided of forming the second semiconductor layer 74 only in a region where the wiring is not formed, which will be fully described below.

FIGS. 8A through 10A are sectional views taken along the line I-I' of FIG. 2 for illustrating a nonvolatile memory device and a method of fabricating the same, according to further embodiments of the present invention. FIGS. 8B through 10B are sectional views taken along the line II-II' of FIG. 2 for illustrating a nonvolatile memory device and a method of fabricating the same, according to further embodiments of the present invention.

Figure 8A:
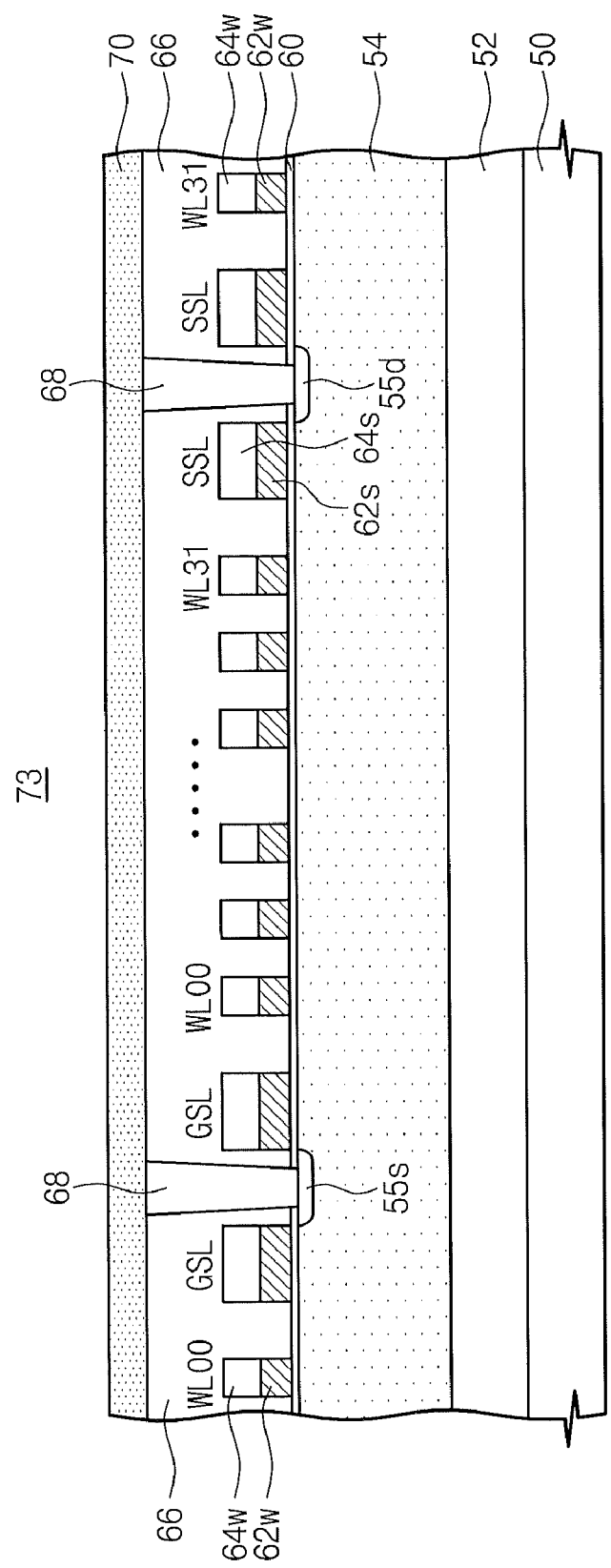
Figure 8B:
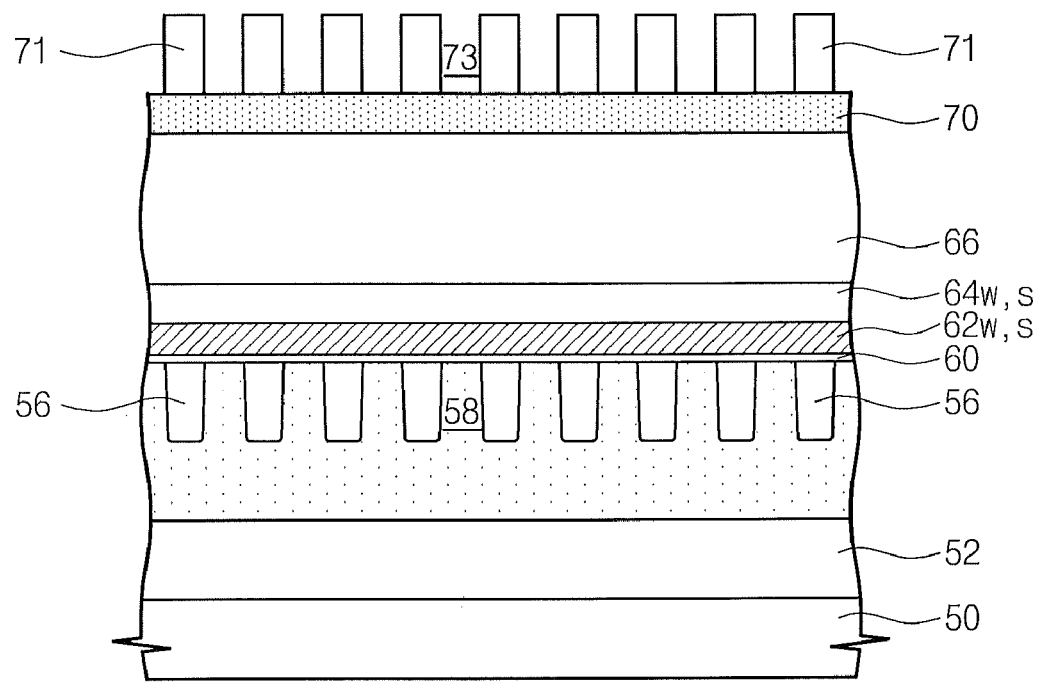

Referring to FIGS. 8A and 8B, similar to the embodiments discussed above, a first semiconductor layer 70 is formed where a second well region of a first conductivity type is formed. A mold pattern 71 having openings 73 is formed to define an active region. The mold pattern 71 may correspond to a device isolation region. Therefore, the mold pattern 71 may be formed to a sufficient thickness for device isolation. Also, the mold pattern 71 may be formed in a region where wiring connected to the semiconductor substrate 50 is formed.

Figure 9A:
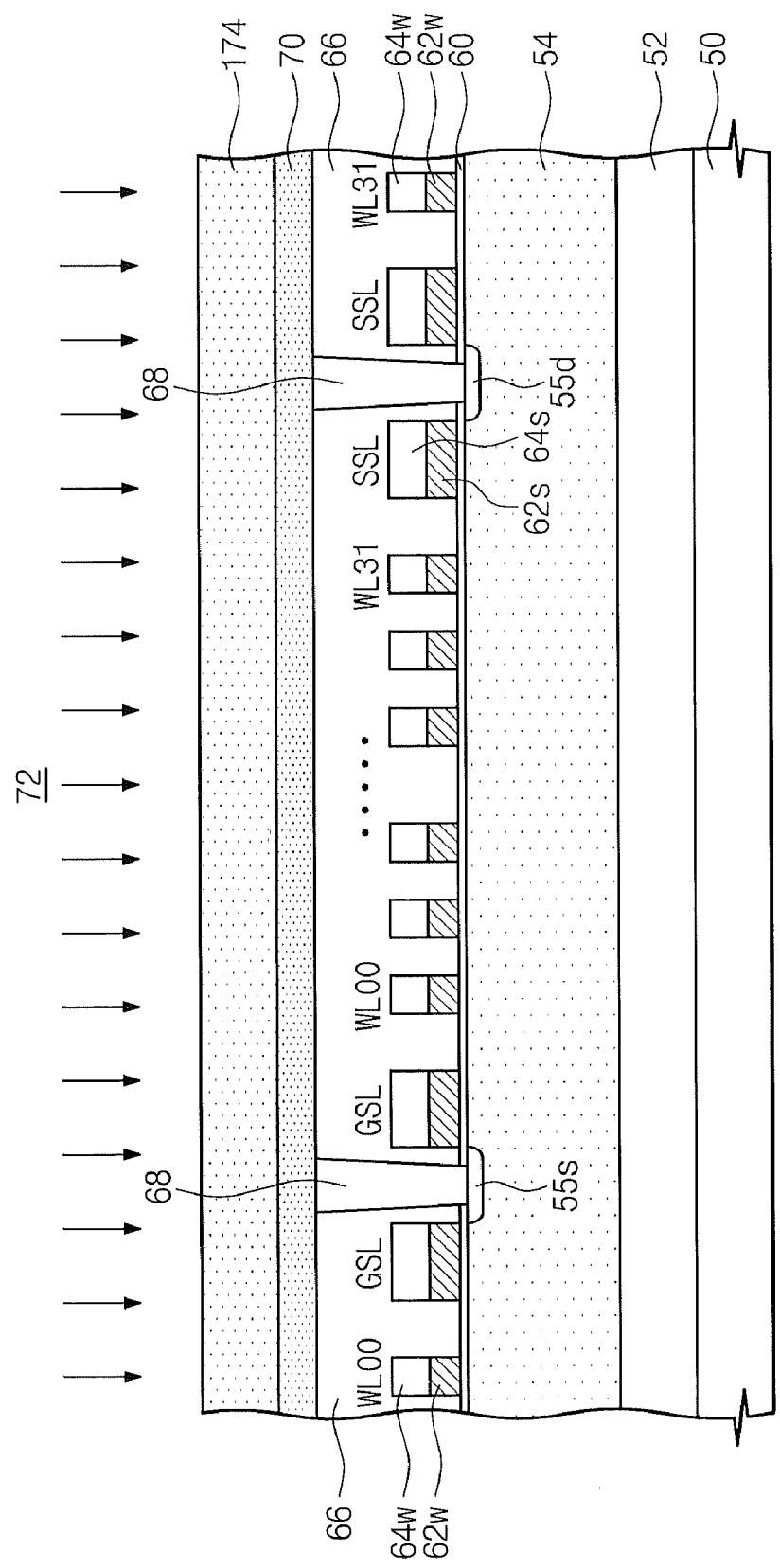
Figure 9B:
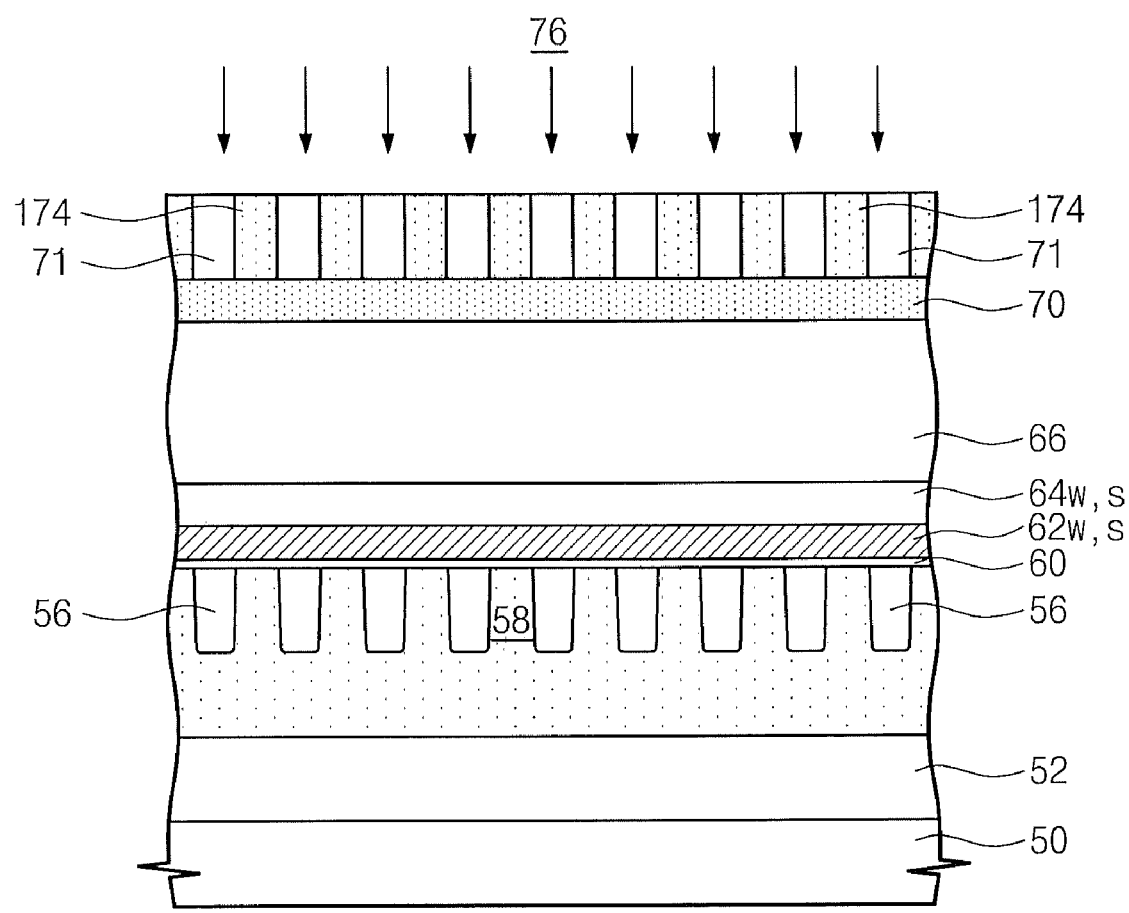

Referring to FIGS. 9A and 9B, a semiconductor layer may be formed on an entire surface of the semiconductor substrate 50 to form a second semiconductor layer 174 so as to fill the openings 73. The second semiconductor layer 174 may be crystal-grown from the first semiconductor layer 70 exposed through the openings 73 to fill the openings 73. Next, impurities are implanted into the second semiconductor layer 174 to form a third well region of a first conductivity type. A border of the third well region may be defined by the mold pattern 71. The third well region may have a doping concentration less than that of the second well region, and have a well concentration equal or similar to the first well region.

Figure 10A:
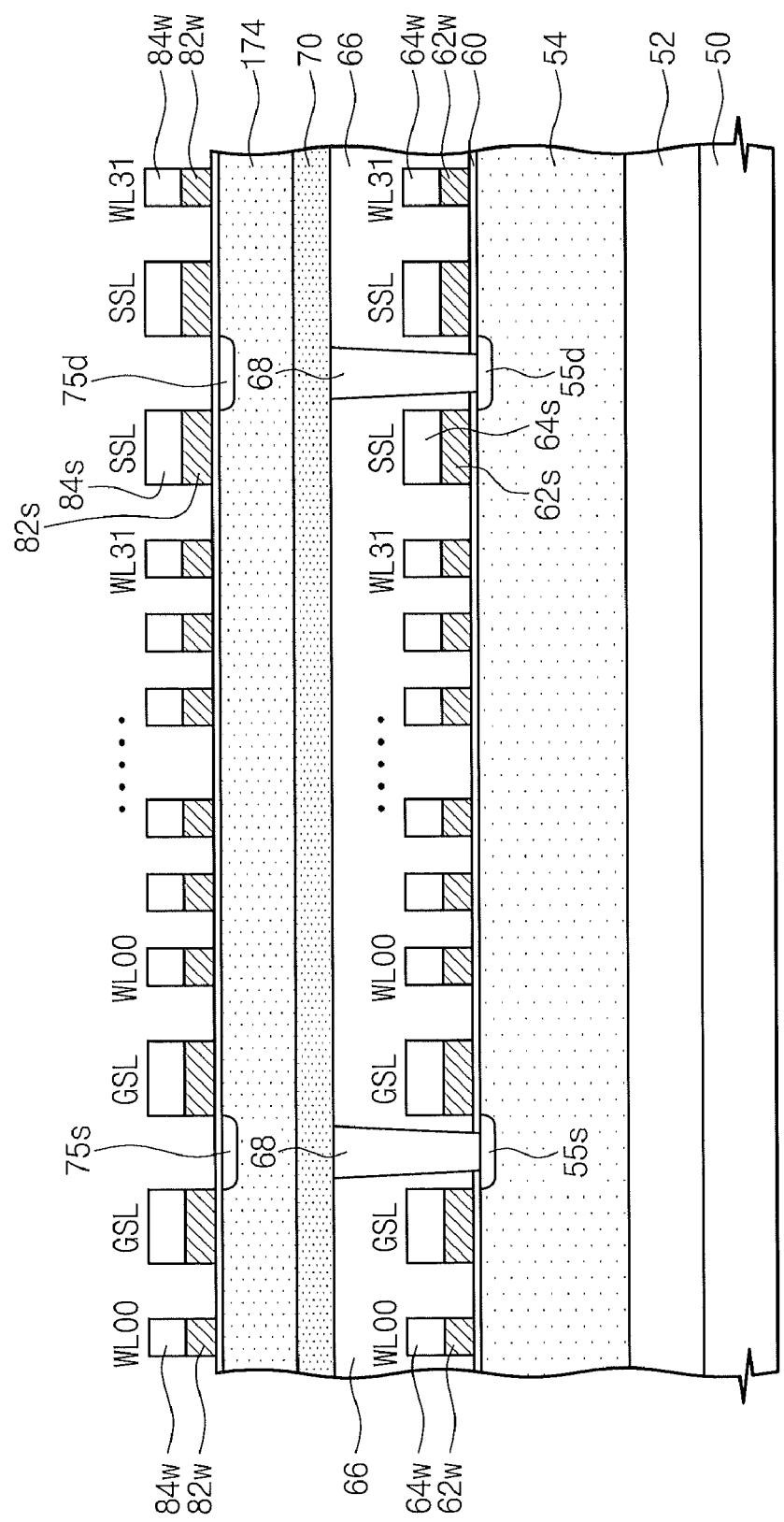
Figure 10B:
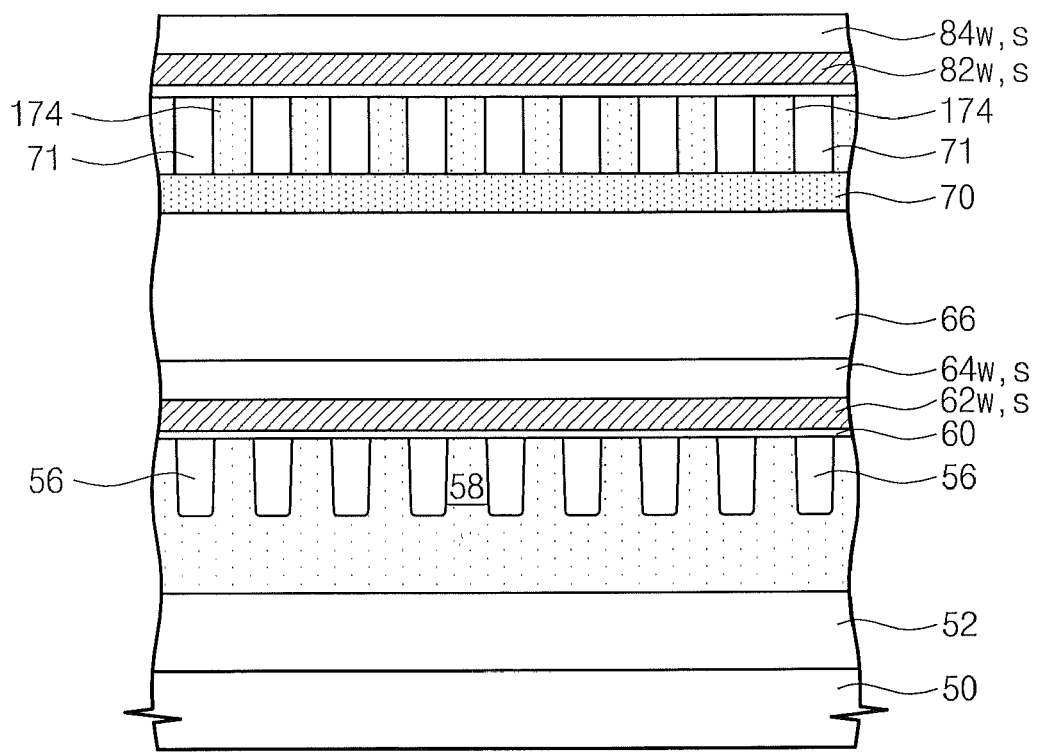

Referring to FIGS. 10A and 10B, a gate insulating layer 180 is formed on the second semiconductor layer 174, and a ground select line GSL, a string select line SSL, and word lines WLn are formed on the gate insulating layer 180. The mold pattern 71 may correspond to a device isolation layer, and a bottom surface of the device isolation layer may contact an upper surface of the first semiconductor layer 70. Identically to FIG. 3A, a source region 75s and a drain region 75d may be formed in the second semiconductor layer 74.

In the above described embodiments of the present invention, the second well region may be limitedly formed in the first semiconductor layer 70 such that it is aligned with the active region defined in the second semiconductor layer 74 and 174 by implanting impurities into the first semiconductor layer 70 using the device isolation layer 78 or the mold pattern 71 as an ion implantation mask.

Figure 11:
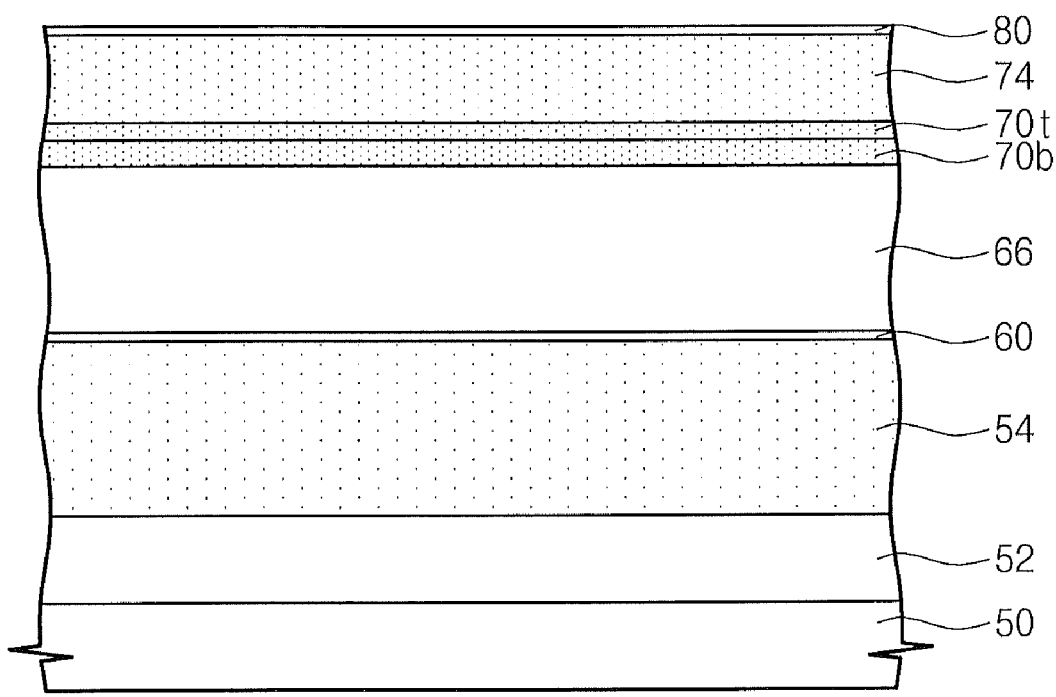
FIG. 11 is a cross-sectional view for illustrating a well structure according to some embodiments of the present invention.

FIG. 11 is a cross-sectional view for illustrating a well structure according to some embodiments of the present invention.

Referring to FIG. 11, the same well structure as that formed on the semiconductor substrate 50 may be formed on the first semiconductor layer 70. That is, the first semiconductor layer 70 may include a second conductivity type well 70b and a second well region 70t of a first conductivity type formed on the second conductivity type well 70b. The first semiconductor layer 70 may include a plurality of second well regions 70t of a first conductivity type. The second conductivity type well 70b may be formed under the second well regions 70t or between the second well regions 70t.

Some embodiments of the present invention may be applied to a floating gate type nonvolatile memory device and a charge trap type nonvolatile memory device.

Figure 12:
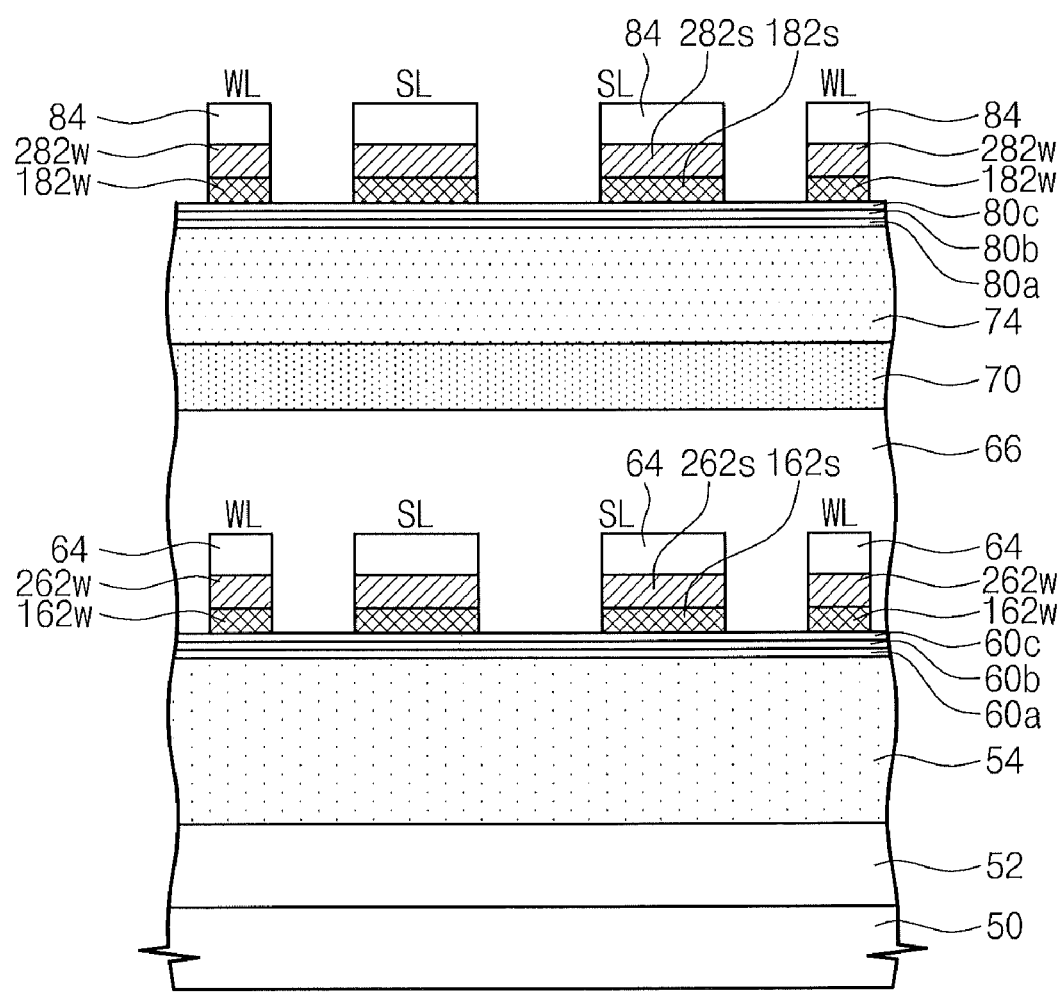
FIGS. 12 and 13 are cross-sectional views for illustrating a transistor structure according to some embodiments of the present invention.
Figure 13:
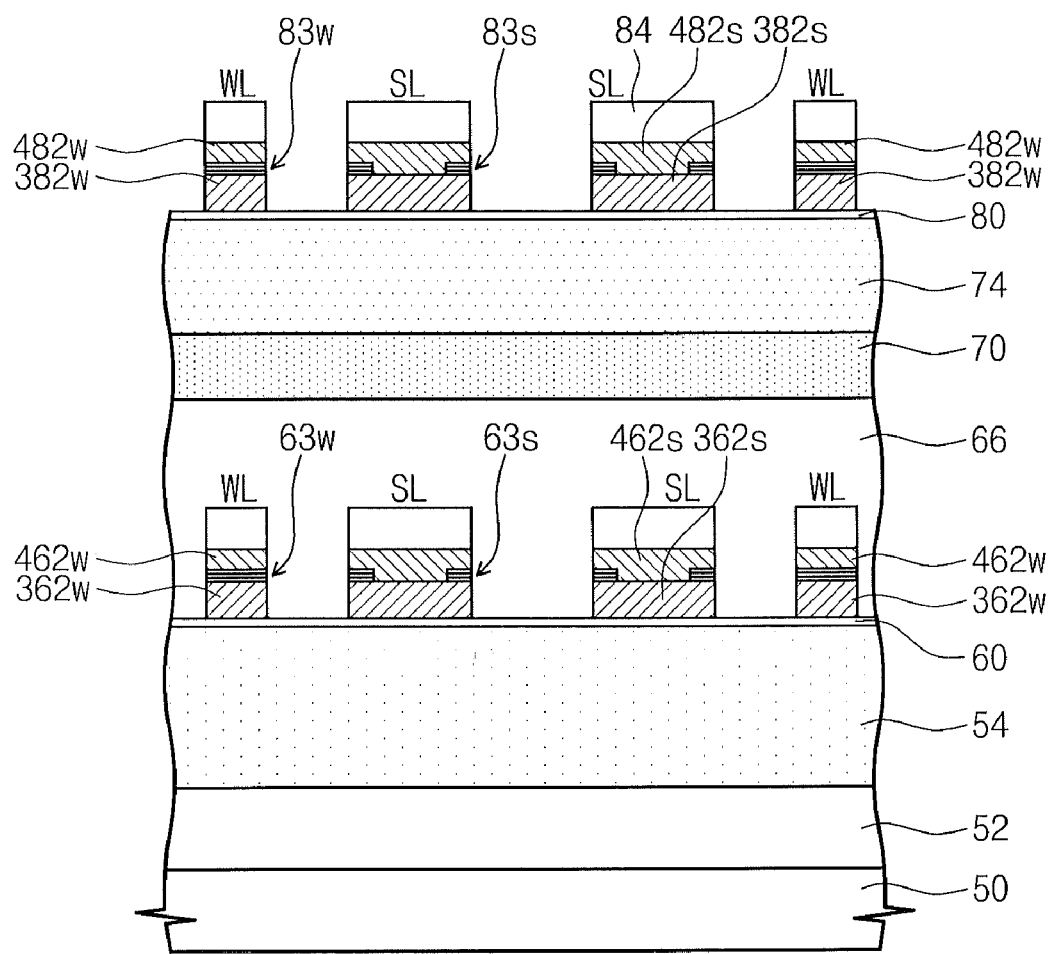

FIGS. 12 and 13 are cross-sectional views illustrating structures of a nonvolatile memory device, according to some embodiments of the present invention.

Referring to FIG. 12, gate insulating layers of the charge trap type nonvolatile memory device include a stack structure of tunnel insulating layers 60a and 80a, charge trap layers 60b and 80b, and blocking insulating layers 60c and 80c, respectively. Memory cell gate electrodes 162w and 182w may be formed on the gate insulating layers to constitute word lines WL, and select gate electrodes 162s and 182s are formed on the gate insulating layers to constitute select gate lines SL, respectively.

On the other hand, a gate insulating layer 60 of the floating gate type nonvolatile memory device may be a single layer. A gate insulating layer of the word line WL may have a thickness equal to or less than a gate insulating layer of the select gate lines SL.

The word line WLn may include a floating gate 362w, an inter-gate dielectric layer 63w, and a control gate electrode 462w. The select line SL may include a lower gate 362s, an inter-gate insulating layer 63s, and an upper gate 462s. A portion of the inter-gate insulating layer 63s may be removed to connect the lower gate 362s to the upper gate 462s.

In some embodiments of the present invention, the semiconductor layer formed over the semiconductor substrate may be formed by using epitaxial growth using CVD, crystallization of amorphous silicon using annealing or laser after forming the amorphous silicon, and/or bonding a semiconductor substrate onto an interlayer insulating layer. The semiconductor layer may be thinner than the well formed in the semiconductor substrate and the first semiconductor layer may be thinner than the second semiconductor layer. For example, the depth of the well region formed in the semiconductor substrate may be approximately 6000 Å, the thickness of the first semiconductor layer may be approximately 1000 Å, and the thickness of the second semiconductor layer may be approximately 2000 Å. Also, the semiconductor layer may be formed at a temperature of about 800° C.

After forming the semiconductor layer and/or after forming the device isolation layer in the semiconductor layer, semiconductor crystals may be hardened or their crystallization may be improved using thermal or laser annealing.

As described above, according to some embodiments of the present invention, because electrical resistances are equal or similar to each other between a semiconductor substrate and a semiconductor layer where cell arrays are formed, a voltage drop associated with the semiconductor layer can be suppressed and sufficient current can be supplied.

Also, although the semiconductor layer is not relatively thick, a well resistance can be reduced by increasing a well concentration, and the semiconductor layer can be formed in the same well structure as that of the semiconductor substrate, thereby decreasing dispersion of cell property of a memory device.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

That which is claimed:

1. A memory device, comprising:
   a semiconductor substrate having a first well region of a first conductivity type;
   at least one semiconductor layer formed on the semiconductor substrate and having a second well region of a first conductivity type of which a concentration is higher than a concentration of the first well region of the first conductivity type;
   a first device isolation layer formed on the semiconductor substrate to define a plurality of first active regions;
   a second device isolation layer formed on the semiconductor layer to define a plurality of second active regions; and
   a ground select line, a string select line, and word lines disposed on each of the semiconductor substrate and the semiconductor layer such that they cross over the first active regions and/or the second active regions.

2. The memory device of claim 1, further comprising:
   an interlayer insulating layer interposed between the semiconductor layer and the semiconductor substrate; and
   a semiconductor plug that penetrates the interlayer insulating layer;
   wherein the semiconductor layer is crystal grown from the semiconductor plug.

3. The memory device of claim 1, wherein a depth of the first well region is greater than a depth of the second well region.

4. The memory device of claim 1, wherein the second well region formed in the semiconductor layer is disposed lower than the second device isolation layer and a third well region of the first conductivity type having a doping concentration less than that of the second well region is formed in the semiconductor layer over the second well region.

5. The memory device of claim 1, further comprising a second conductivity type well region formed under the second well region in the semiconductor layer.

6. The memory device of claim 4, wherein the third well region is formed between the second device isolation layers in the semiconductor layer and a border of the third well region is defined by the second device isolation layers.

7. The memory device of claim 4, wherein the semiconductor layer comprises a first semiconductor layer and a second semiconductor layer on the first semiconductor layer; wherein the second well region is formed in the first semiconductor layer, and the third well region is formed in the second semiconductor layer.

8. The memory device of claim 7, further comprising a second conductivity type well formed under the second well region in the first semiconductor layer.

9. The memory device of claim 8, wherein a plurality of second well regions are formed in the first semiconductor layer, and the second conductivity type well is formed under the second well regions and interposed between the second well regions to isolate the second well regions from each other.

* * * * *